United States Patent [19]

Takubo et al.

[11] Patent Number: 5,061,956
[45] Date of Patent: Oct. 29, 1991

[54] OPTICALLY IMAGING METHOD AND APPARATUS

[75] Inventors: Minoru Takubo, Tokyo; Toshio Fukasawa, Ebina; Tatsuo Yamanaka, Yokohama, all of Japan

[73] Assignee: Nippon Seiko Kabushiki Kaisha, Tokyo, Japan

[21] Appl. No.: 491,505

[22] Filed: Mar. 12, 1990

[30] Foreign Application Priority Data

Mar. 15, 1989 [JP]  Japan .................................. 1-63275

[51] Int. Cl.$^5$ ............................................. G03B 27/52
[52] U.S. Cl. ........................................ 355/55; 355/53; 355/77
[58] Field of Search ........................ 355/53, 55, 71, 77

[56] References Cited

U.S. PATENT DOCUMENTS

| | | | |
|---|---|---|---|
| 3,495,512 | 2/1970 | Vaughan | 355/53 |
| 4,668,077 | 5/1987 | Tanaka | 355/53 X |
| 4,737,823 | 4/1988 | Bouwer et al. | 355/53 |
| 4,811,055 | 3/1989 | Hirose | 355/77 X |
| 5,008,702 | 4/1991 | Tanaka et al. | 355/55 X |

FOREIGN PATENT DOCUMENTS 61-220895  3/1985  Japan .
63-246296  9/1989  Japan .

*Primary Examiner*—Richard A. Wintercorn
*Attorney, Agent, or Firm*—Basile and Hanlon

[57] ABSTRACT

An optically imaging method and an apparatus therefor are disclosed. The illuminating lens and first imaging lens of an optical lens system comprising the four lenses of first and second illuminating lenses and first and second imaging lenses sandwich a pattern source. Moving the second illuminating lens and first imaging lens in unit with a distance therebetween fixed can image a pattern image at a desired magnification at an image point of the second imaging lens falling within an allowable object space focal depth and produce an illuminant image of an illuminant falling within an allowable entrance pupil position range of a projection lens so that an opening ratio of the illuminant image falls within a predetermined range. An illuminant image of a high contrast and a good telecentricity is produced. In a magnification adjustment of the pattern image, a distance between the second imaging lens and projection lens need not be corrected but the second illuminating lens and first imaging lens may be simply moved in unit.

3 Claims, 10 Drawing Sheets

(c)

(d)

REAL IMAGE TAKING $i_1$ AS VIRTUAL IMAGE

OPTICALLY IMAGING METHOD AND APPARATUS

BACKGROUND OF THE INVENTION

1. Field of the Invention

The present invention relates to improvements in an optically imaging method and apparatus of a reduction projection aligner or the like which projects a projected pattern of a pattern source onto an exposed material, e.g., by means of illuminating light from a light source.

2. Description of the Related Art

Heretofore, a pattern generator with a variable aperture has been generally employed for a pattern lithograrhy printing a nonrectangular pattern on an exposed material. This prior-art pattern generator provides a rectanglar pattern normally provided by two pairs of opposite blades both the pairs together constituting a variable aperture defining apparatus and stepwise and repeatedly projects the rectangular pattern through an optical lens system onto an exposed material thereby to generate an optional exposed pattern in the form of an approximate circle, an approximate triangle, square or the like.

The prior-art pattern lithography with the pattern generator entails a problem in that it requires much a printing time, since an assembly of rectangular patterns provides a predetermined exposed pattern, a single exposure operation cannot generate an optional pattern on the exposed material and dimensions of each rectangular pattern must be instructed and the exposed material must be 2-dimensionally moved to generate the optional pattern.

In order to solve the problem, the present applicant proposed a variable aperture defining apparatus which has at least one pair of two opposite blades each movable relative to the other, at least one of the two opposite blades having a V-shaped notch, so as to generate an optional polygonal pattern in Japanese Utility Model Application No. SHO 36-42799. In this case, there is yet a problem in that the variable aperture defining apparatus can generate an approximately circular pattern but cannot generate a complete circular pattern and dimensions of the polygonal patten can be stepwise changed but cannot be steplessly changed. Japanese Unexamined Application Publication No. SHO 61-220895 also discloses an optical plotter for drawing an approximate circle which draws an approximate circle by means of two pairs of blades each pair having a notch or recess. This prior-art plotter also entails such a problem as in Japanese Utility Model Application No. SHO 63-42799.

Thus, the present applicant proposed a pattern printing method and an apparatus therefor which did not mechanically change a pattern image of the variable aperture defining apparatus or the like but rather optically changed a magnification of a patten image in Japanese Patent Application No. SHO 63-24629. The teaching of this Japanese Patent Application No. SHO 63-24629 is that illuminating light from a light source is projected onto a pattern source, an optical lens system produces the resulting projected image of the pattern source on an exposed material, at least one of the pattern source and the exposed material is moved along an optical axis, or a magnification correcting lens is provided between the pattern source and optical lens system, at least one of the pattern source and magnification correcting lens being moved in the optical axis and then the patten source and magnification correcting lens being moved while maintaining moving positions thereof so that the imaging position of the magnification correcting lens conincides with a pretermined position, whereby a magnification on the exposed material of the projected pattern is steplessly changed.

In accordance with the prior-art pattern printing method and apparatus of Japanese Patent Application No. SHO 63-24629, however, there is yet a problem in that a magnification between the projected pattern of the pattern source and a similar projected pattern produced on the exposed material can be optionally changed while any of the pattern source, exposed material and magnification correcting lens must be moved along the optical axis in order to change the magnification and while since the imaging position of the projected pattern produced on the exposed material is displaced by each movement, a corresponding displacement must be compensated, so that an adjustment for changing the magnification is complicated and the resolution of the projected pattern produced on the exposed material is reduced.

SUMMARY OF THE INVENTION

Therefore, the present invention was made in view of the prior-art outstanding problems. An object thereof is to provide an optically imaging method and apparatus in which a plurality of lenses are arranged on an optical axis to together provide an optical system, a pair of lenses of the optical system sandwiching a pattern source therebetween and the pattern source are displaced relative to each other so that the distance between the lenses of the pair remains, whereby a magnification of a pattern image can be changed while an opening ratio of a light source image produced at the entrance pupil position of a projection lens falls within an allowable range.

In order to achieve this object, an invention of claim 1 provides an optically imgaging method by which illuminating light from an illuminant is transmitted onto an exposed material by means of an optical system comprising at least a pattern source with a projected pattern and a projection lens opposite to the exposed material to image the projected pattern on the exposed material, the optical lens system having an arrangement in which a first illuminating lens, a second illuminating lens, the pattern source, a first imaging lens and a second imaging lens are arranged in this order on an optical axis, the first illuminating lens producing a first illuminant image outside the image space focal point of the first imaging lens, the second illuminating lens producing a second illuminant image from the first illuminant image outside the object space focal point, the first imaging lens producing a third illuminant image from the second illuminant image at the same magnification as that of the first illuminant image on the first illuminant image outside the image space focal point of the first imaging lens and producing the first pattern source image from the pattern source, a second imaging lens producing a fourth illuminant image from the third illuminant image at an allowable entrance pupil position of the projection lens and producing a second pattern source image from the first pattern source image within an allowable object space focal depth of the projection lens, a pair of the second illuminating lens and first imaging lens and the pattern source being displaced relative to each other so that a distance between the second illuminating lens and first imaging lens is fixed, thereby a magnification of the second pattern source image being optionally selectable so that the second pattern image falls within the allowable object space focal depth of the projection lens and the fourth illuminant image falls on the entrance pupil position or within an allowable entrance pupil range of the projection lens.

An invention of claim 2 provides an optically imaging apparatus in which illumianting light from an illuminant is transmitted onto an exposed material by means of an optical system comprising at least a pattern source with a projected pattern and a projection lens opposite to the exposed material to image the projected pattern on the exposed material, wherein the optical system comprises: a first illuminating lens producing a first illuminant image from the illuminant outside the image space focal point of the first illuminating lens; a second illuminating lens producing a second illuminant image within the image space focal point of the second illuminating image from the first illuminant image produced by the first illuminating lens so that the first illuminant image is taken as a virtual image; a first imaging lens producing a first pattern image from a projected pattern of a pattern source provided within the image space focal point of the second illuminating lens outside the image space focal point of the first imaging lens and producing a third illuminant image from the second illuminant image at the same magnification as that of the first illuminant image on the first illuminant image; and a second imaging lens having the first pattern image and third illuminant image produced by the first imaging lens, outside the object space focal point of the second imaging lens, the second imaging lens producing the first pattern image withinin an allowable object space focal depth of the projection lens and producing a fourth illuminant image from the third illuminant image at an allowable entrance pupil position of the projection lens, the first illuminating lens, second illuminating lens, first imaging lens and second imaging lens being arranged in sequence on an optical axis, a pair of the second illuminating lens and first imaging lens and the pattern source being movable relative to each other so that a distance between the second illuminating lens and first imaging lens is fixed.

An invention of claim 3 provides an optically imaging apparatus in which the distance between the second illuminating lens and first imaging lens is smaller than the total of the focal lengths of the second illuminating lens and first imaging lens so that the pattern source and the second illuminant image are within the image space focal point of the second illuminating lens outside the object space focal point of the first imaging lens.

In accordance with the optically imaging method and apparatus of claims 1 and 2, moving the pair of the second illuminating lens and first imaging lens and the pattern source relative to each other changes the magnification of the second pattern image produced at an image point outside the image space focal point of the second imaging lens. In this case, a displacement of the second pattern image attendant on the change in the magnification of the second pattern image can fall within the allowable object space focal point range of the projection lens, a displacement of the fourth illuminant image of the illuminant to be produced at the entrance pupil position of the projection lens can fall within an allowable range, and an opening ratio of the fourth illuminant image can fall within an allowable range, so that a simple relative movement between the pair of the second illuminating lens and first imaging lens and the pattern source can change the magnification of the second pattern image without a need for a correction of a distance between the second imaging lens and projection lens.

The optically imaging apparatus of claim 3 produces the second illuminant image taking as a virtual image the first illuminant image produced by the first illuminating lens outside the object space focal point of the first imaging lens and produces the third illuminant image from the second illuminant image by means of the first imaging lens at the position of the first illuminant image at the same magnification as that of the first illuminant image, so that a displacement of the third illuminant image can be reduced when the the second illuminating lens and first imaging lens is moved in unit.

In accordance with the optically imaging method and apparatus of claims 1 and 2, an illuminant image of a high contrast and a good telecentricity is produced. In a magnification adjustment of the pattern image, a distance between the second imaging lens and projection lens need not be corrected but the second illuminating lens and first imaging lens may be simply moved in unit. Thus, the control of the movement of the unit of the second illuminating lens and first imaging lens is easy and in a high accuracy.

DESCRIPTION OF THE PREFERRED EMBODIMENTS

The preferred embodiments of the present invention will be hereinafter described with reference to the drawings.

Figure 1:
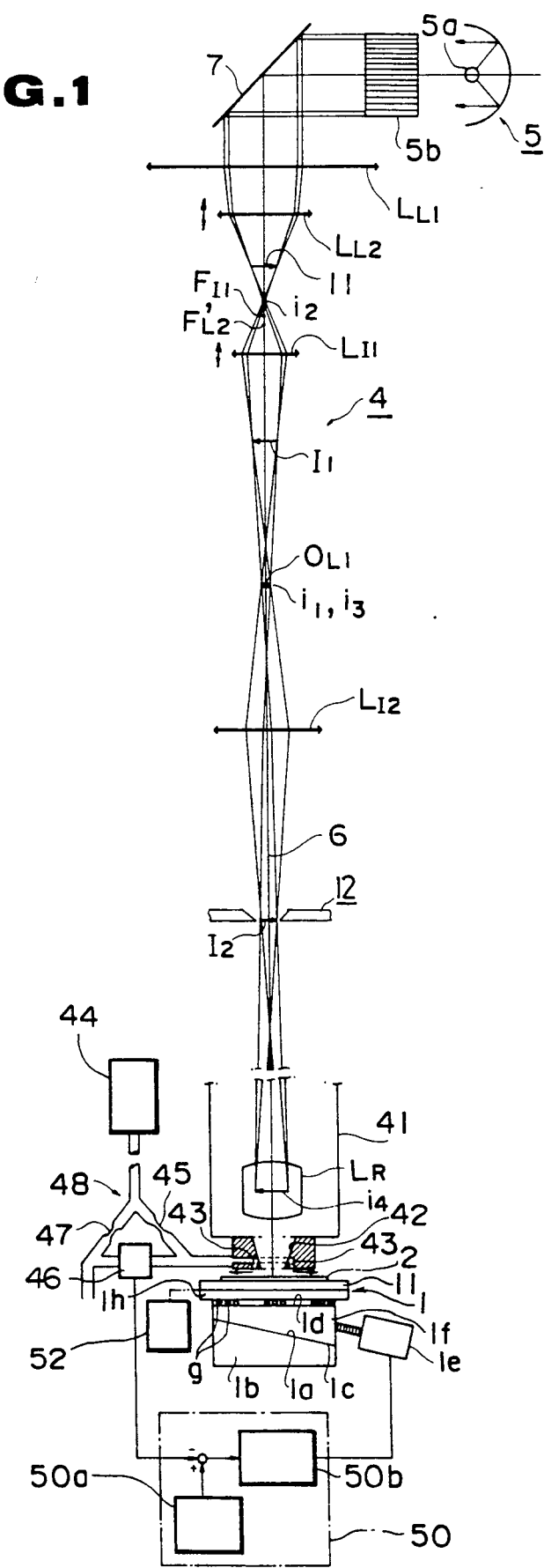
FIG. 1 is a schematic illustration of an optically imaging apparatus of one embodiment of the present invention.

FIG. 1 is a schematic illustration of a first embodiment of a reduction projection aligner to which the present invention is applied.

An XYZ-stage carrying an exposed material 2, e.g., a master for shadow mask and movable along XYZ-directions is indicated at 1. An optical lens system 4 with a variable aperture defining mechanism 12 is placed above the XYZ-stage 1. An illuminant 5 comprising a xenon lamp 5b and a fly array lens 5c is placed above the optical lens system 4 through a reflector 7. Illuminating or exposure light from the illuminant 5 is transmitted through the reflector 7 and the optical lens system 4 onto the exposed material 2 placed on the XYZ-stage 1 to reduction-project and image a projected pattern provided at the variable aperture defining mechanism 12 of the optical lens system 4 on the exposed material 2.

The XYZ-stage 1 comprises a base 1b having a top oblique guiding surface 1a progressively lowered rightwards, a Z-axial table $1f$ having a bottom oblique surface $1c$ mating the guiding oblique surface $1a$ of the base $1b$, having a top horizontal surface $1d$ and movable between right and left by a linear drive mechanism $1e$ comprising a drive motor and ball screw and the like, an X-axial table $1h$ mounted through rolling elements $1g$, e.g., balls on the Z-axial table $1f$ and slidable between right and left, and a Y-axial table $1i$ mounted on the X-axial table $1h$ and slidable in the antero-posterior direction. The linear drive mechanism $1e$ slides the Z-axial table $1f$ between right and left of FIG. 1 along the guiding oblique guiding surface $1a$ to move the exposed material 2 placed on the Y-axial table $1i$ along an optical axis 6.

The optical lens system 4 comprises a first illuminating lens $L_{L1}$ opposite to the illuminant 5 through the reflector 7, a second illuminating lens $L_{L2}$ and a first imaging lens $L_{I1}$ both provided within an image point $O_{L1}$ of the first illuminating lens $L_{L1}$, a reticle 11 provided between the two lenses $L_{L2}$ and $L_{L1}$ and constituting a pattern source, e.g., a circular pattern, a second imaging lens $L_{I2}$ placed outside the image point $O_{L1}$ of the first illuminating lens $L_{L1}$, and a reduction lens $L_R$ constituting a projection lens and provided so that an image point $O_{I2}$ of the second imaging lens $L_{I2}$ falls within an object space focal depth of the reduction lens $L_R$, the above-described elements of the optical lens system 4 being serially arranged on the optical axis 6.

A distance 1 between the second illuminating lens $L_{L2}$ and first imaging lens $L_{I1}$ is selected to be shorter than the total $(f_{L2} + f_{I1})$ of the focal length $f_{L2}$ of the second illuminating lens $L_{L2}$ and the focal length $f_{I1}$ of the first imaging lens $L_{I1}$ so that the reticle 11 and a virtual image $i_2$, as described hereinafter, provided by the second illuminating lens $L_{L2}$ fall within the image space focal length $f_{L2}$ of the second illumnating lens $L_{L2}$ outside the object space focal length $f_{I1}$ of the first imaging lens $L_{I1}$. The pair of the second illuminating lens $L_{L2}$ and first imaging lens $L_{I1}$ are movable along the optical axis 6 relative to the leticle 11 so as to maintain the length 1 constant.

Figure 2:
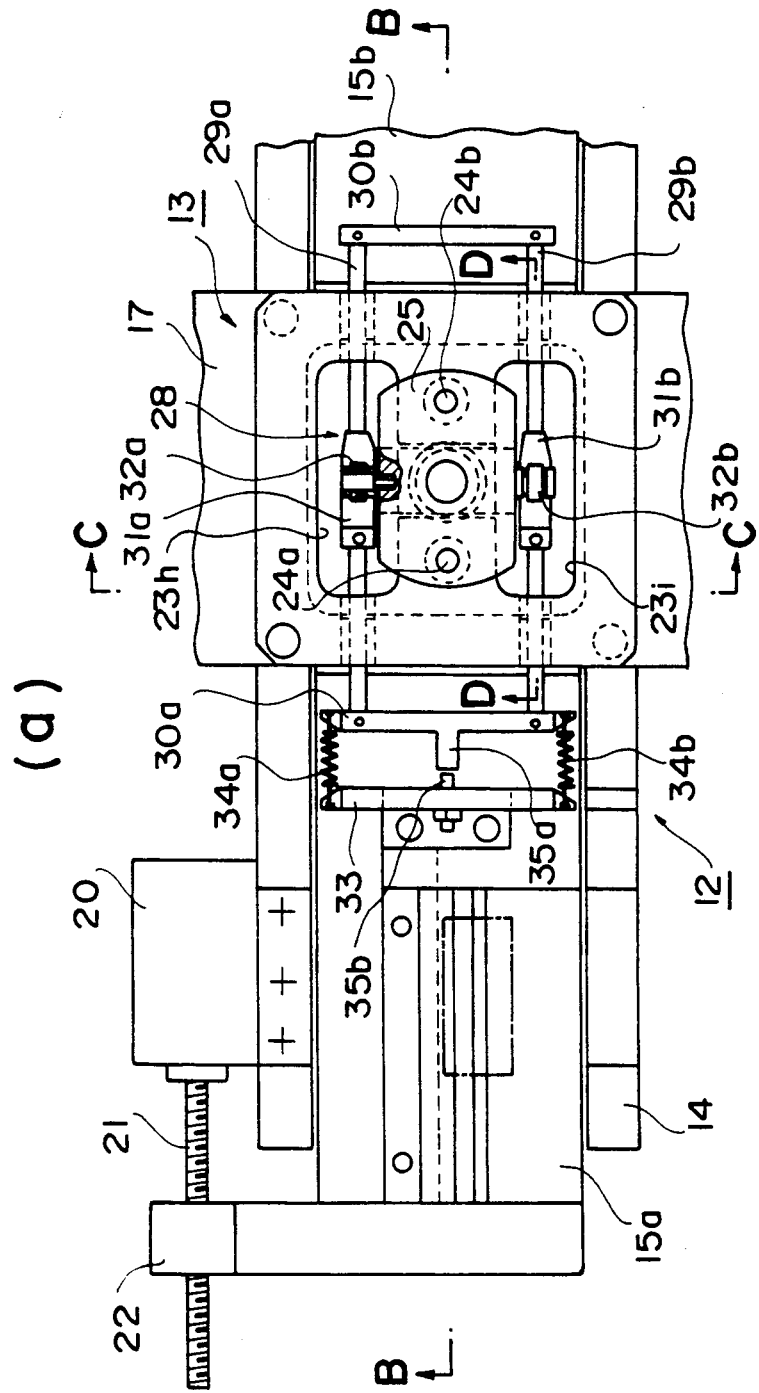
FIG. 2(a) is a plan view of a variable aperture defining mechanism.
FIG. 2(b) is a section through the variable aperture defining mechanism of FIG. 2(a) taken along line B—B.
FIG. 2(c) is a section through the variable aperture defining mechanism of FIG. 2(a) taken along line C—C.
FIG. 2(d) is a section through the variable aperture defining mechanism of FIG. 2(a) taken along line D—D.
Figure 2:
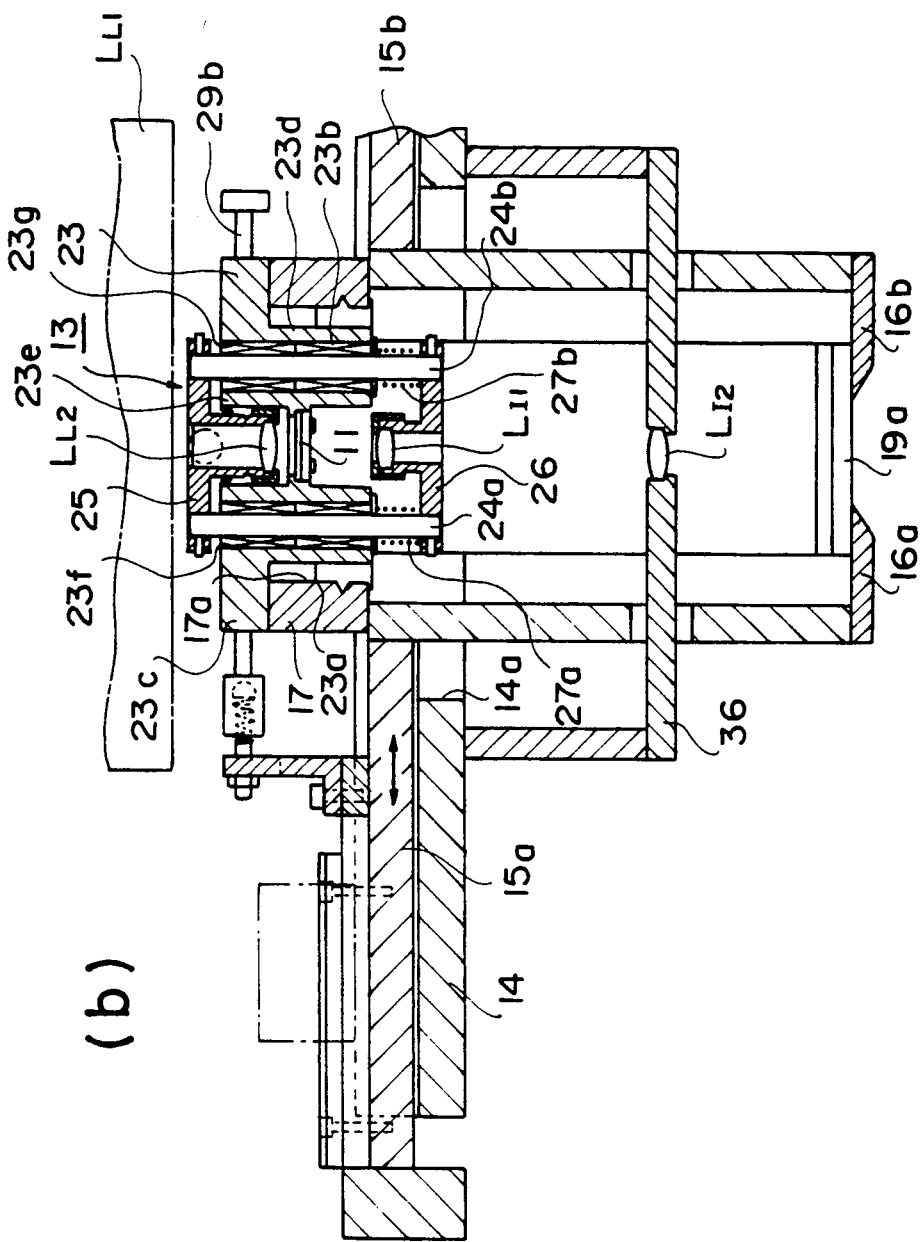
Figure 2:
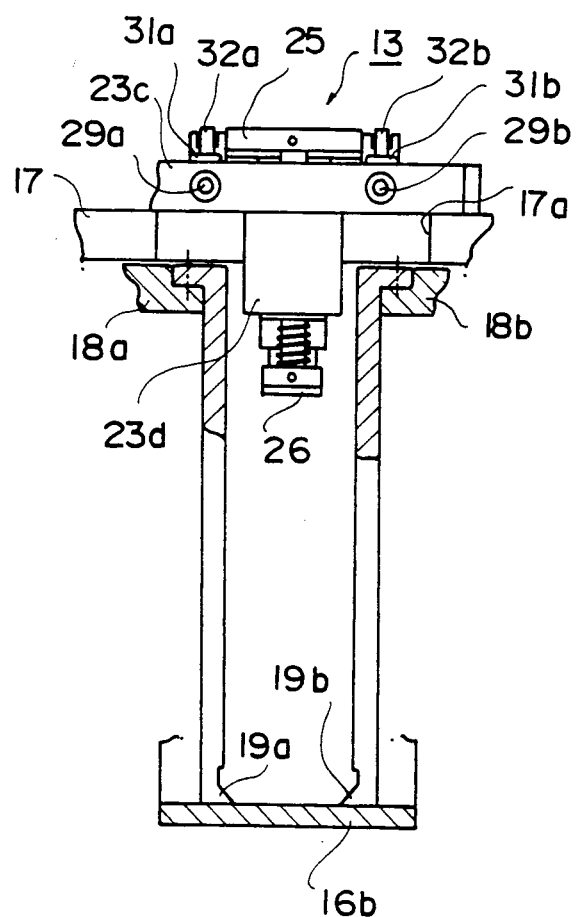
Figure 2:
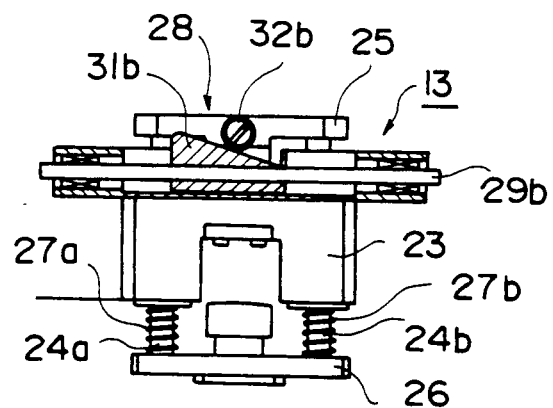
Figure 3:
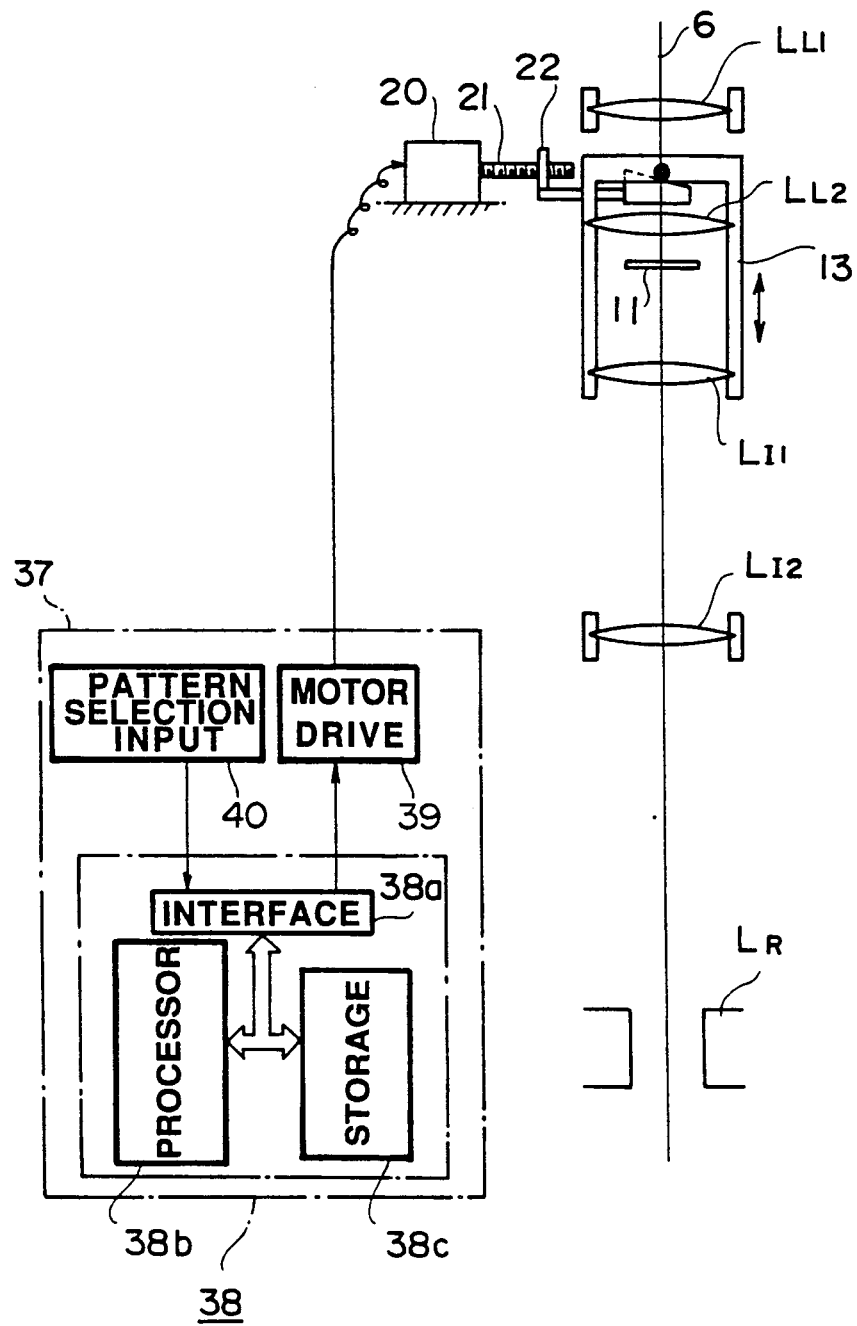
FIG. 3 is a block diagram of one embodiment of a pattern control apparatus.

As shown in FIGS. 2(a)-2(d), the lenses $L_{L2}$ and $L_{I1}$ and the reticle 11 are supported by a support mechanism 13 removably mounted on the variable aperture defining mechanism 12. The variable aperture defining mechanism 12 comprises: a guide 14 with a rectangular-U shaped cross-section fastened to a fixed framework, extending along the X-axis and having a square opening $14a$ at the center of the guide 14; a pair of slide plates $15a$ and $15b$ slidably guided by the guide 14; a pair of blades $16a$ and $16b$ each having a knife-edged front end and attached to respective opposite opening $14a$ side ends of the slide plates $15a$ and $15b$; a guide 17 with an upside-down rectangular-U shaped cross-section fastened to the center of the guide 14, extending along the Y-axis and having a square opening $17a$ at the center of the guide 17; a pair of slide plates $18a$ and $18b$ slidably guided by the guide 17 as shown in FIG. 2(c); and a pair of blades $19a$ and $19b$ each having a nife-edged front end and attached to respective opposite opening $14a$ side ends of the slide plates $18a$ and $18b$. Thus, the two pairs of blades $16a$, $16b$, $19a$ and $19b$ together provide a square pattern. A ball screw drive mechanism comprising a drive motor 20, a screw shaft 21 driven by the drive motor 20, and a ball nut 22 mating the screw shaft 21 and fastened to each of the blades $15a$, $15b$, $18a$ and $18b$ moves corresponding one of the blades $15a$, $15b$, $18a$ and $18b$. As seen in FIGS. 2(a)-2(d), an illustration of the ball screw drive mechanism for each of the blades $15b$, $18a$ and $18b$ is eliminated.

The support mechanism 13 comprises a support framework 23 the center portion of which is removably mounted within the opening $17a$ in the guide 17 of the variable aperture defining mechanism 12 and retains the reticle 11, an upper retainer 25 which is fastened to the upper ends of slide shafts $24a$ and $24b$ vertically guided by linear ball bearings $23a$ and $23b$ mounted within the support framework 23 and retains the second illuminating lens $L_{L2}$, lower retainer 26 fastened to the lower ends of the slides $24a$ and $24b$ and retaining the first imaging lens $L_{I1}$, a pair of compression coiled springs $27a$ and $27b$ respectively seated around the slide shafts $24a$ and $24b$ between the underside of the support framework 23 and topside of the lower retainer 26, and a vertical drive mechanism 28 vertically moving the upper retainer 25.

The support framework 23 comprises a horizontal plate portion $23c$ and a vertical an upside-down rectangular-U shaped portion $23d$ integrally adjoined to the underside of the horizontal plate portion $23c$. A through-hole $23e$ extends through the center of the horizontal plate portion $23c$ and the vertical upside-down rectangular-U shaped portion $23d$. An intermediate portion of the inner wall surface of the through-hole $23e$ has an aperture defining flange the underside of which removably retains the reticle 11 providing a circular pattern. Opposite left-hand and right-hand through-holes $23f$ and $23g$ of the through-hole $23e$ extend through the horizontal plate portion $23c$ and vertical upside-down rectangular-U shaped portion $23d$. The respective linear ball bearings $23a$ and $23b$ are mounted within the through-holes $23f$ and $23g$.

As shown in FIGS. 2(a)-2(d), in accordance with a vertical drive mechanism 28, a pair of slide shafts $29a$ and $29b$ extends between right and left past the centers of the antero-posterior axes of rectangular recesses $23h$ and $23i$ defined in the support framework 23 symmetrically in rear and front of the through-hole $23e$ defined in the horizontal plate portion of the support framework 23, a connecting rod $30a$ connects the left-hand ends extending outside the support framework 23 of the slide shafts $29a$ and $29b$, a connecting rod $30b$ connects the right-hand ends extending outside the support framework 23 of the slide shafts $29a$ and $29b$, a pair of cams $31a$ and $31b$ each having a cam surface progressively lowering rightwards are respectively mounted to portions of the slide shafts $29a$ and $29b$ corresponding to the recesses $23h$ and $23i$, a pair of cam followers $32a$ and $32b$ respectively made with rolling bearings the outer races of which are in contact with the cam surfaces of the cams $31a$ and $31b$ are mounted to the upper retainer 25, a pair of tension springs $34a$ and $34b$ connects the connecting rod $30a$ to a stand 33 fastened to the top surface of the slide plate $15a$, and a projection $35a$ provided on the connecting rod $30a$ and a stop $35b$ provided on the stand 33 and having an adjustable projection amount can be in contact with each other. A movement of the slide plate $15a$ moves the slide shafts $29a$ and $29b$ to vertically move the upper and lower retainers 25 and 26 in unit.

A support 36 mounted to the underside of the guide 14 of the variable aperture defining mechanism 12 passes into a blade support stand. The center of the support 36 retains the second imaging lens $L_{I2}$. The position of the second imaging lens $L_{I2}$ is selected so that the image point $O'_{I1}$ at which the first pattern image $I_1$ of the circular pattern of the reticle 11 produced by the second imaging lens $L_{f2}$ coincides with a position at which the two pairs of blades 16a, 16b, 19a and 19b together define a square pattern.

A pattern control device 37 controls the drive motor 20 of the variable aperture defining mechanism 12.

The pattern control device 37 comprises: a microcomputer 38 including at least an input/output interface 38a, a processor 38b and a storage 38c; a motor drive circuit 39; and a pattern selection input unit 40 inputting a projection magnification of a projected pattern to the microcomputer 38.

When the pattern selection input unit 40 inputs projection magnification determining data, the processor 38 of the microcomputer, in response to the inputted projection magnification determining data, refers to a stored table previously stored in the storage 38c, computes a target displacement of the unit of the second illuminating lens $L_{L2}$ and first imaging lens $L_{f1}$ corresponding to the projection magnification, and produces a displacement instruction to the motor drive circuit 39 in response to a difference between the target displacement and a current position of the unit of the lenses $L_{L2}$ and $L_{f1}$ to control the drive motor 20 to determine the projection magnification.

Turning back to FIG. 1, the bottom opposite the exposed material 2 of a fixed hollow cylinder 41 retaining a reduction lens $L_R$ has an aperture 42 passing exposure light and four air supply nozzles 43 provided circumferentially at equal intervals around the aperture 42. Each of the nozzles 43 communicates with a common air supply source 44 through a restriction 45 and with one input port of a common differential pressure transducer 46. The other input port of the differential pressure transducer 46 communicates with the air supply source 44 through a restriction 47 and with the atmosphere. The nozzles 43, air supply source 44, restrictions 45 and 47 and differential pressure transducer 46 together constitute an air micrometer 48.

A detection signal of the differential pressure transducer 46 is produced to a stage or focal point adjustment control device 50. The focal point adjustment control device 50 compares the detection signal of the differential transducer 46 with a target value predetermined by a target value determinant 50a and produces a deviation signal constituting a differential value from the comparison to a drive circuit 50b comprising an amplifier etc. The drive circuit 50b produces a drive output controlling an actuator, e.g., a motor to a linear drive mechanism 1e for the XYZ-stage 1 to cause the linear drive mechanism 1e to adjust a distance between the nozzles 43 and exposed material 2 to a proper value.

XYZ-axial movements of the XYZ-stage 1 are controlled by measured value feedback signals from a detector 52 in a sequent step-and-repeat manner so that an origin mark (not shown) provided on the exposed material 2 is optically read, a control origin is determined on the basis of the read origin mark and a detector 52, e.g., a laser length measuring machine detecting absolute distances along the XY-axes in response to an exposure cycle of the projected pattern produces the measured value feedback singnals.

Hereinafter, the operation of the above-described embodiment will be described.

Figure 4:
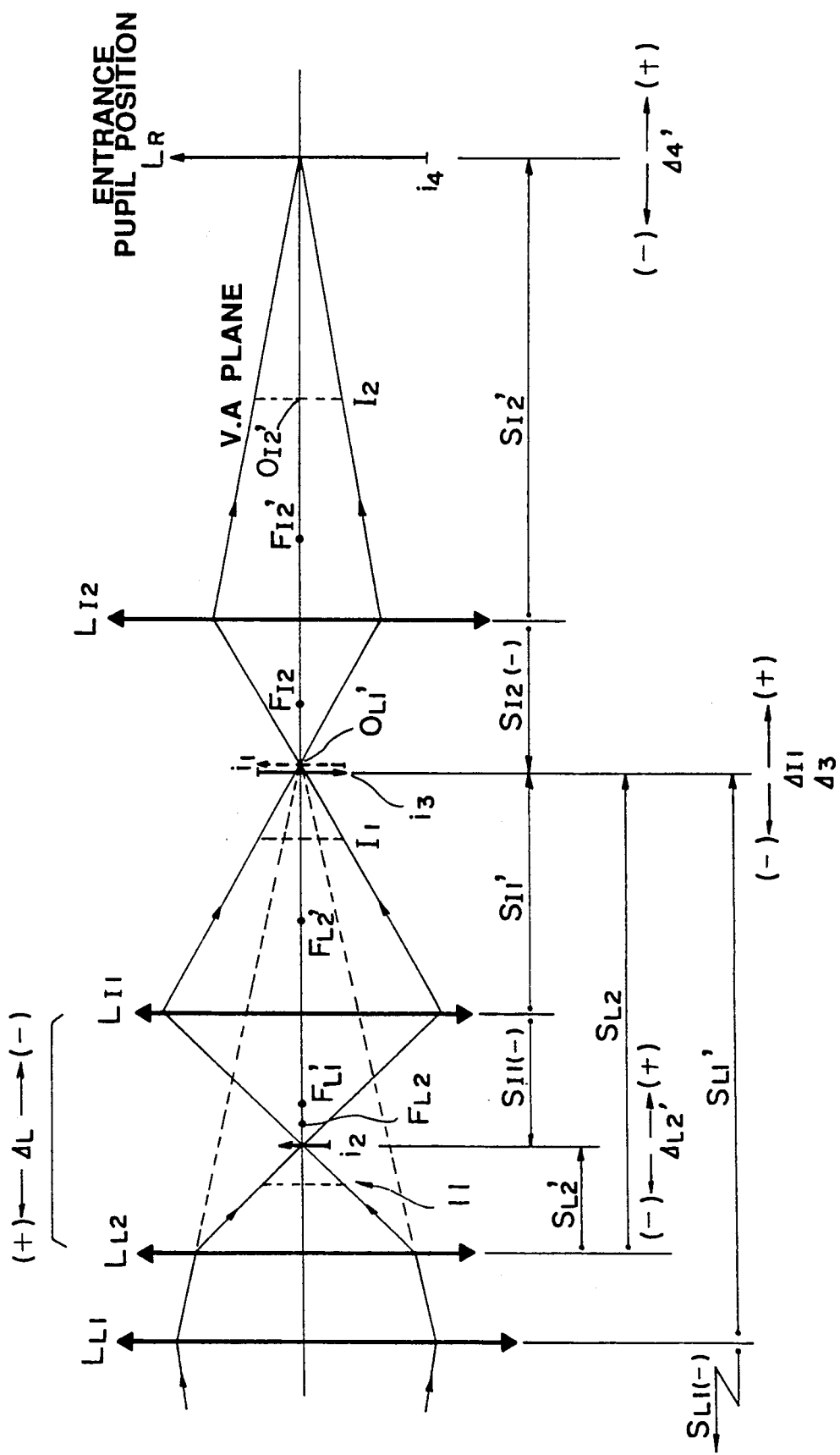
FIGS. 4–11 are schematic diagrams of an optical system illustrating the operation of the present invention.

As shown in FIG. 4, exposure light from an outgoing end of the fly array lens 5b of the illuminant 5 is reflected by the reflector 7 to the first illuminating lens $L_{L1}$. The first illuminating lens $L_{L1}$ produces the first illuminant image $i_1$ at an image point $O_{L1}$ thereof. The second illuminating lens $L_{L2}$ produces the second illuminant image $i_2$ from the first illuminant image $i_1$ within the image space focal point $F'_{L2}$ outside the object space focal point $F_{f1}$ of the first imaging lens $L_{f1}$ so as to take the first illuminant image $i_1$ as a virtual image. The first imaging lens $L_{f1}$ produces the third illuminant image $i_3$ as large as the first illuminant image $i_1$ from the second illuminant image $i_2$ at a position conincident with that of the first illuminant image $i_1$. The second imaging lens $L_{f2}$ produces the fourth illuminant image $i_4$ from the third illuminant image $i_3$ at the entrance pupil position of the reduction lens $L_R$.

Figure 5:
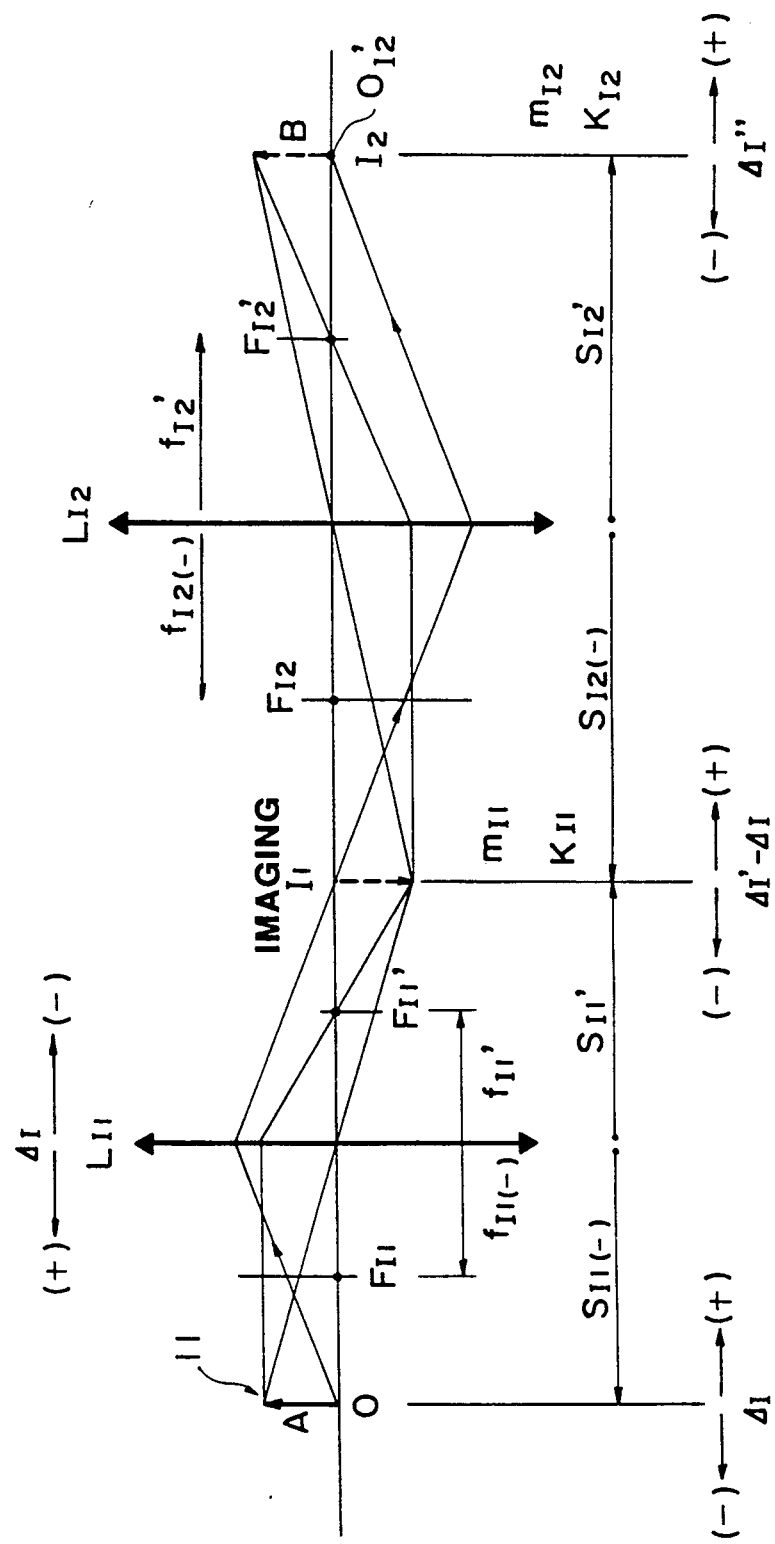

On the other hand, as shown in FIG. 5, the first imaging lens $L_{f1}$ produces the first pattern image $I_1$ at the image point $O'_{f1}$ thereof from the circular pattern of the reticle 11 provided within the image space focal point $F'_{L2}$ of the second illuminating lens $L_{L2}$. The second imaging lens $L_{f2}$ produces a second pattern image $I_2$ from the first pattern image $I_1$ at the image point $O'_{f2}$ of the reduction lens $L_R$ within the allowable object space focal depth of the reduction lens $L_R$. The reduction lens $L_R$ reduces the second pattern image $I_2$ to provide same onto the exposed material 2 placed on the XYZ-stage 1. Thus, since the circular pattern of the reticle 11 is imaged at the image point $O'_{f2}$ of the second imaging lens $L_{f2}$ falling within the allowable object space focal depth of the reduction lens $L_R$, the reticle 11 is equivalently positioned at the image point $O'_{f2}$, so that the lens $L_{L1}$, $L_{L2}$, $L_{f1}$ and $L_{f2}$ appears to together constitute a single condenser lens.

In accordance with this arrangement, concurrently moving the second illuminating lens $L_{f2}$ and first imaging lens $L_{f1}$ relative to the reticle 11 by means of the pattern control device 15 changes the magnification of the pattern image produced at the image point $O'_{f2}$ of the second imaging lens $L_{f2}$ so that the opening ratio of the illuminant image of the illuminant 5 incident to the entrance pupil of the reduction lens $L_R$ can fall within an allowable range.

Hereinafter, the principle that changing the distance of the unit of the second illuminating lens $L_{L2}$ and first imaging lens $L_{f1}$ from the reticle 11 changes the magnification of the second pattern image $I_2$ will be described.

First, a relationship between a displacement $\Delta$ of an object point O of the single thin lens and a displacement $\Delta'$ of a corresponding image point O' of the single thin lens which relationship underlies the present invention.

Figure 6:
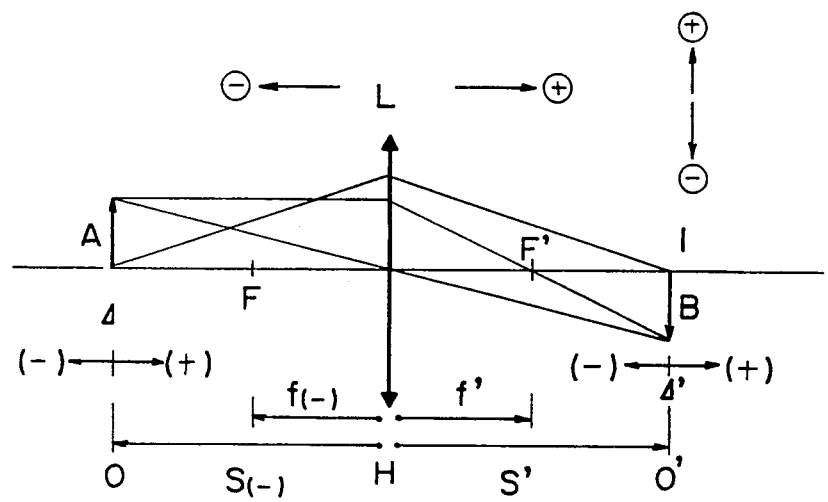

As illustrated in FIG. 6, where the object space focal length of the thin lens is indicated at f, the image space focal length thereof is indicated at f', a distance from the principal point H of the thin lens to the object point O is indicated at S, a distance from the principal point H to the image point O' is indicated at S', the magnitude of an object positioned at the object point O is indicated at A, the magnitude of a corresponding image produced at the image point O' is indicated at B, and a magnification is represented by m, the following imaging equation is provided:

$$1/S' = 1/S + 1/f \quad (1)$$

The magnification m is expressed by the following equation:

$$m = S'/S = B/A \quad (2)$$

Therefore, the distances S and S' are expressed from the equations (1) and (2) as follows:

$$S = f[1/m - 1] \quad (3)$$

$$S' = f[1 - m] \quad (4)$$

The relationship between the desplacement $\Delta$ of the object point O and displacement $\Delta'$ of the image point $\Delta'$ is expressed from the equation (1) as follows:

$$\frac{1}{S' + \Delta'} = \frac{1}{S + \Delta} + \frac{1}{f} \quad (5)$$

In this case, the rate of change K of an after-displacement magnification m* to a before-displacement mgnification m is expressed as follows:

$$K = m^*/m \quad (7)$$

Substituting the equations (1), (3) and (5) for m* and m of the equation (7) and then arranging the resulting equation produce the following equation:

$$K = \frac{(S' + \Delta')/(S + \Delta)}{S'/S} = 1 - \frac{\Delta'}{mf} \quad (8)$$

The image point displacement $\Delta'$ is expressed as follows:

$$\Delta' = mf(1 - K) \quad (9)$$

Likewise, the rate of change K is expressed with reference to the object displacement $\Delta$ as follows:

$$K = \frac{f}{f + S + \Delta} \cdot \frac{f + S}{f} = \frac{f}{f - m} \quad (10)$$

The object displacement $\Delta$ is expressed as follows:

$$\Delta = \frac{f}{m} \cdot \frac{K - 1}{K} \quad (11)$$

Subtracting the equation (11) from the equation (9) provides the following equation:

$$\Delta' - \Delta = mf(1 - K) - \frac{f}{m} \cdot \frac{K - 1}{K} = (m^2 K - 1). \quad (12)$$

Consequently, the relationship between the image point displacement $\Delta'$ and object point displacement $\Delta$ is expressed as follows:

$$\Delta' = \Delta(m^2 K - 1) + \Delta = \Delta m^2 K \quad (13)$$

Thus, since when the first imaging lens $L_{l1}$ is displaced by a displacement $\Delta_1$ so that the circular pattern of the reticle 11 is imaged at the image point $O'_{l2}$ of the second imaging lens $L_{l2}$, as shown in FIG. 5, the relationship between the displacement $\Delta_1$ of the first imaging lens $L_{l1}$ and a displacement $\Delta''_I$ of the image point $O'_{l2}$ of the second imaging lens $L_{l2}$ is equivalent with reference to the first imaging lens $L_{l1}$ to the relationship between a displacement $\Delta_1$ by which the reticle 11 is displaced in a direction opposite that of the displacement of the first imaging lens $L_{l1}$ and the displacement $\Delta''_I$ of the image point $O'_{l2}$ of the second imaging lens $L_{l2}$, a displacement of the first pattern image $I_1$ caused by the first imaging lens $L_{l1}$ is expressed by the expression $\Delta'_I - \Delta_I$. Where a before-displacement magnification is represented by $m_{l1}$, an after-displacement magnification is represented by $m_{l1}^*$, and the rate of change in magnification is represented by $K_{l1}(=m_{l1}^*/m_{l1})$, the following equation is derived from the equation (12):

$$\Delta'_I - \Delta_I = \Delta_I(m^2_{l1}K_{l1} - 1) \quad (14)$$

An image point displacement $\Delta''_I$ of the second imaging lens $L_{l2}$ is expressed where a before-displacement magnification is represented by $m_{l2}$, an after-displacement magnification is represented by $m_{l2}^*$, and the rate of change in magnification is represented by $K_{l2}(=m_{l2}^*/m_{l2})$, the following equation is derived from the equation (13);

$$\Delta''_I = (\Delta'_I - \Delta_I) m_{l2} K_{l2} = (m^2_{l1} K_{l1} - 1) m_{l2} K_{l2} \quad (15)$$

On the other hand, the object point displacement $\Delta_I$ of the first imaging lens $L_{l1}$ is expressed from the equation (11) as follows:

$$\Delta_I = \frac{f_{l1}}{m_{l1}} \cdot \frac{K_{l1} - 1}{K_{l1}} \quad (16)$$

An object point displacement $(\Delta'_I - \Delta_I)$ of the second imaging lens $L_{l2}$ is also expressed from the equation (11) as follows:

$$\Delta'_I - \Delta_I = \frac{f_{l2}}{m_{l2}} \cdot \frac{K_{l2} - 1}{K_{l2}} \quad (17)$$

A rato of change in magnification $K_{l1}$ is expressed from the equation (10) as follows:

$$K_{l1} = \frac{f_{l1}}{f_{l1} - m_{l1}\Delta_I} \quad (18)$$

A rate of change in magnification $K_{l2}$ is also expressed from the equation (10) as follows:

$$K_{l2} = \frac{f_{l2}}{f_{l2} - (\Delta'_I - \Delta_I)m_{l2}} = \frac{f_{l2}(f_{l1} - \Delta_I m_{l1})}{f_{l2}(f_{l1} - m_{l1}\Delta_I) - \Delta_I m_{l2}(m^2_{l1}f_{l1} - f_{l1} + m_{l1}\Delta_I)} \quad (19)$$

Where the first imaging lens $L_{l1}$ is displaced by the displacement $\Delta_I$, a general magnification $K_I$ provided at the image point $O'_{l2}$ of the second imaging lens $L_{l2}$ is expressed as follows:

$$K = K_{l1} K_{l2} = \frac{f_{l1} \cdot f_{l2}}{f_{l2}(f_{l1} - m_{l1}\Delta_I) - \Delta_I m_{l2}(m^2_{l1}f_{l1} - f_{l1} + m_{l1}\Delta_I)} \quad (20)$$

Transforming the equation (20) provides the displacement $\Delta_I$ of the first imaging lens $L_{l1}$, which is expressed as follows:

$$\Delta_I = \frac{1}{2m_{l2}} \left[ -f_{l2} - \sqrt{f^2_{l2} - 4m_{l2}f_{l1}f_{l2}\frac{K_I - 1}{K_I}} \right] \quad (21)$$

Thus, where the allowable object space focal depth range of the reduction lens $L_R$ is, e.g., 0.4 mm, and the dimensions of the respective lenses are as follows: of the first illuminating lens $L_{L1}$, focal length $f_{L1} = 394.40$ mm, effective diameter $\phi = 79$ mm, F-number = 4.99, distance from principal plane to object point $S_{L1} = -1095.56$ mm, distance from principal plane to image point $S'_{L1} = 290$ mm, and magnification $m_{L1} = -1/3.7778$; of the second illuminating lens $L_{L2}$, focal length $f_{L2} = 76.77$ mm, effective diameter $\phi = 25$ mm, F-number = 3.07, distance from principal plane to object point $S_{L2} = -256.04$ mm, distance from principal plane to image point $S'_{L2} = 59.06$ mm, and magnification $m_{L2} = 1/4.3353$; of the first imaging lens $L_{I1}$, focal length $f_{I1} = 30$ mm, effective diameter $\phi = 17$ mm, F-number = 1.76, distance from principal plane to object point $S_{I1} = -36.92$ mm, distance from principal plane to image point $S'_{I1} = 160.06$ mm, and magnification $m_{I2} = -4.3353$ ($S_{I1} = -60$ mm, $S'_{I1} = 60$ mm and magnification $m_{I1} = -1$ for a pattern image); of the second imaging lens $L_{I2}$, focal length $f_{I2} = 81$ mm, effective diameter $\phi = 32$ mm, F-number = 2.53, distance from principal plane to object point $S_{I2} = -102.44$ mm, distance from principal plane to image point $S'_{I2} = 387$ mm, magnification $m_{I2} = -3.7778$ ($S_{I2} = -202.5$ mm, $S'_{I2} = 135$ mm and magnification $m_{I2} = -1/1.5$ for a pattern image), the displacement $\Delta_I$ of the first imaging lens $L_{I1}$ is produced by the equation (21), given a desired general magnification $K_1$. In this case, when the displacement $\Delta''_I$ of the image point $O'_{I2}$ of the second imaging lens $L_{I2}$ falls within the allowable object space focal depth range of 0.4 mm, a good out-of-focus free pattern image can fall on the reduction lens $L_R$.

The following Table 1 shows the displacement $\Delta_I$, rate of change in magnification $K_{I1}$ and image point displacement $\Delta'_I - \Delta_I$ of the first imaging lens $L_{I1}$ and the rate of change in magnification $K_{I2}$ and image point displacement $\Delta''_I$ of the second imaging lens $L_{I2}$, given the general magnification $K_I$:

TABLE 1

| $K_I$ | $\Delta_I$ | $K_{I1}$ | $\Delta'_I - \Delta_I$ | $K_{I2}$ | $\Delta''_I$ |
|---|---|---|---|---|---|
| 1.15 | 3.795 | 1.1448 | 0.550 | 1.0045 | 0.246 |
| 1.10 | 2.669 | 1.0977 | 0.261 | 1.0022 | 0.116 |
| 1.05 | 1.412 | 1.0494 | 0.070 | 1.0006 | 0.031 |
| 1.01 | 0.296 | 1.0100 | 0.003 | 1.0000 | 0.001 |
| 1.00 | 0.000 | 1.0000 | 0.000 | 1.0000 | 0.000 |
| 0.99 | −0.304 | 0.9900 | 0.003 | 1.0000 | 0.001 |
| 0.95 | −1.600 | 0.9494 | 0.081 | 1.0007 | 0.036 |
| 0.90 | −3.430 | 0.8974 | 0.352 | 1.0029 | 0.157 |
| 0.85 | −5.547 | 0.8440 | 0.865 | 1.0072 | 0.387 |

As seen in Table 1, displacing the first imaging lens $L_{I1}$ leftwards from a position producing the second pattern image of the circular pattern of the reticle 11 at the image point $O'_{I2}$ of the second imaging lens $L_{I2}$ at an equimagnification magnifies the second pattern image $I_2$ and on the other hand, displacing the first imaging lens $L_{I1}$ rightwards from that position reduces the second pattern image $I_2$. When such magnification and reduction ranges are selected within plus minus 15%, the image point displacement $\Delta''_I$ is caused to fall within the allowable object space focal depth range (0.4 mm) of the reduction lens $L_R$, so that the focal length of the reduction lens $L_R$ need not be specially adjusted.

Figure 7:
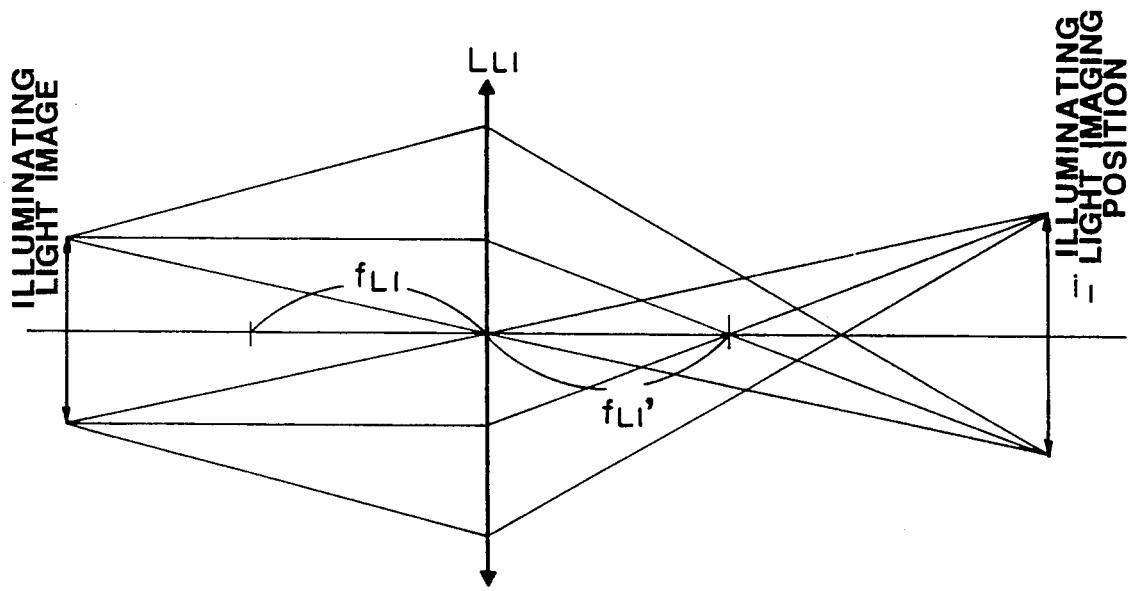
Figure 8:
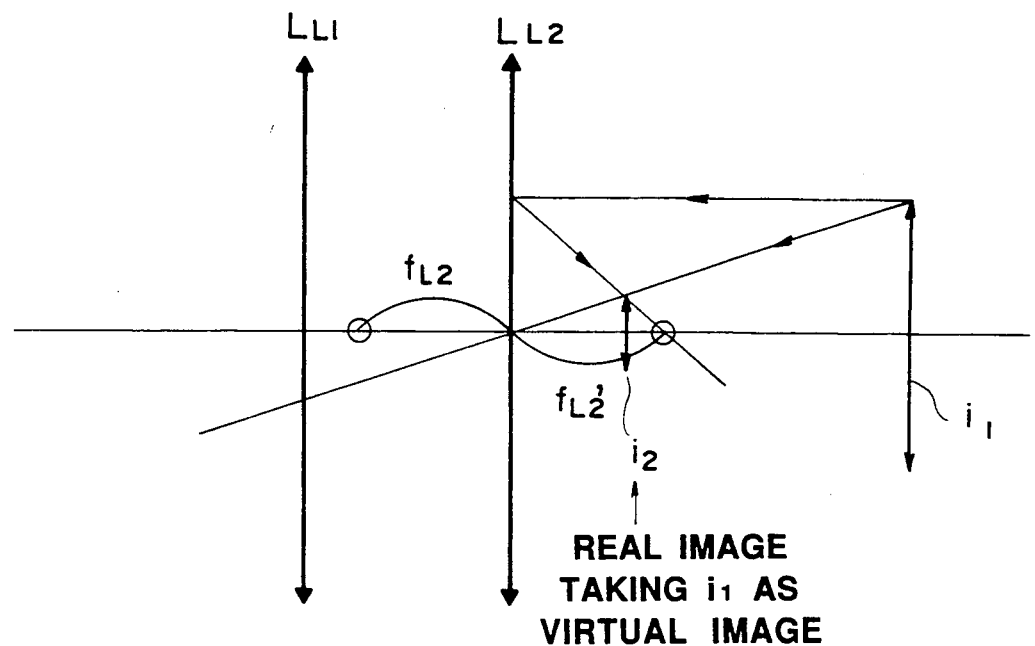

As described above, the illuminating light from the illuminant 5 produces the first illuminant image $i_1$ at the image point $O'_{L1}$ outside the image focal point $F'_{I1}$ of the first imaging lens $L_{I1}$ by means of the first illuminating lens $L_{L1}$, as shown in FIG. 7. As shown in FIG. 8, the second illuminating lens $L_{L2}$ produces the second illuminant image $i_2$ constituting a virtual image inside the image space focal point $F_{L2}$ of the second illuminating lens $L_{L2}$ outside the object space focal point $F_{I1}$ of the first imaging lens $L_{I1}$ from the first illuminant image $i_1$. As shown in FIG. 4, the first imaging lens $L_{I1}$ produces the third illuminant image $i_3$ as large as the first illuminant image $i_1$ at the image point $O'_{L1}$ of the first illuminating lens $L_{L1}$ from the second illuminant image $i_2$. As shown in FIG. 4, the imaging lens $L_{I2}$ produces the fourth illuminant image $i_4$ at the entrance pupil position of the reduction lens $L_R$ from the third illuminant image $i_3$.

Figure 9:
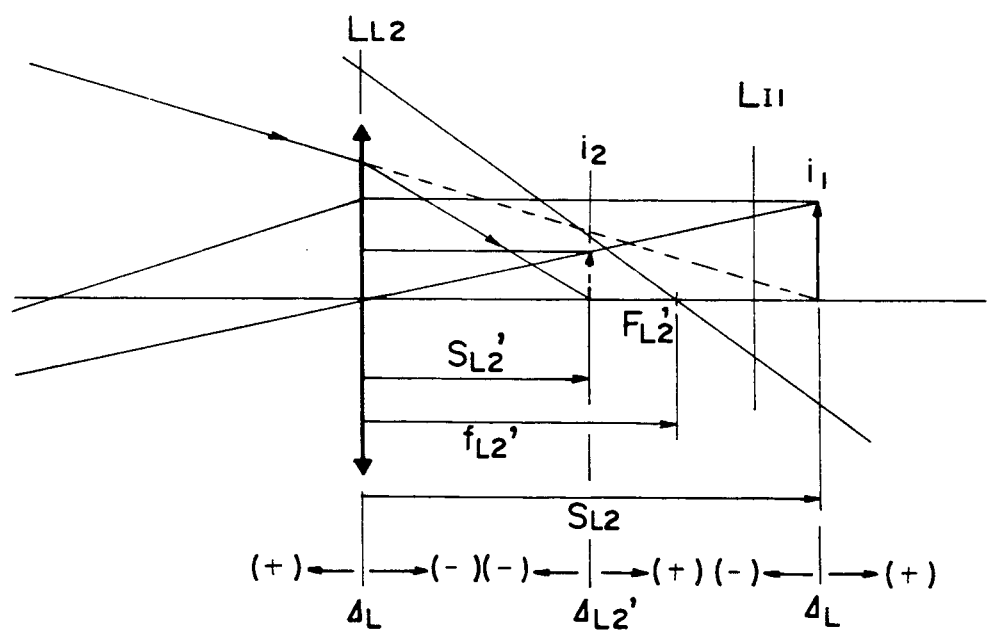

In this case, displacing the unit of the second illuminating lens $L_{L2}$ and first imaging lens $L_{I1}$ by the displacement $\Delta_L$ as shown in FIG. 9 is equivalent to a virtual object point displacement $\Delta_L$ of the first illuminant image $i_1$, so that the image point $O'_{L2}$ of the second illuminating lens $L_{L2}$ at which the illuminant image $i_2$ is produced is displaced relative to the second illuminating lens $L_{L2}$ by the displacement $\Delta'_L$.

Thus, the relationship of the object point displacement $\Delta_L$ and the image point displacement $\Delta'_L$ is expressed from the equation (13) as follows:

$$\Delta'_L = \Delta_L m_{L2}^2 K_{L2} \tag{22}$$

Since the rate of change in magnification $K_{L2}$ is expressed from the equation (10) as follows:

$$K_{L2} = \frac{f_{L2}}{f_{L2} - \Delta_L m_{L2}}, \tag{23}$$

substituting the equation (23) for $K_{L2}$ of the equation (22) provides the image point displacement $\Delta_{L2'}$ which is expressed as follows:

$$\Delta_{L2'} = \frac{\Delta_L m_{L2}^2 f_{L2}}{f_{L2} - \Delta_L m_{L2}}. \tag{24}$$

Figure 10:
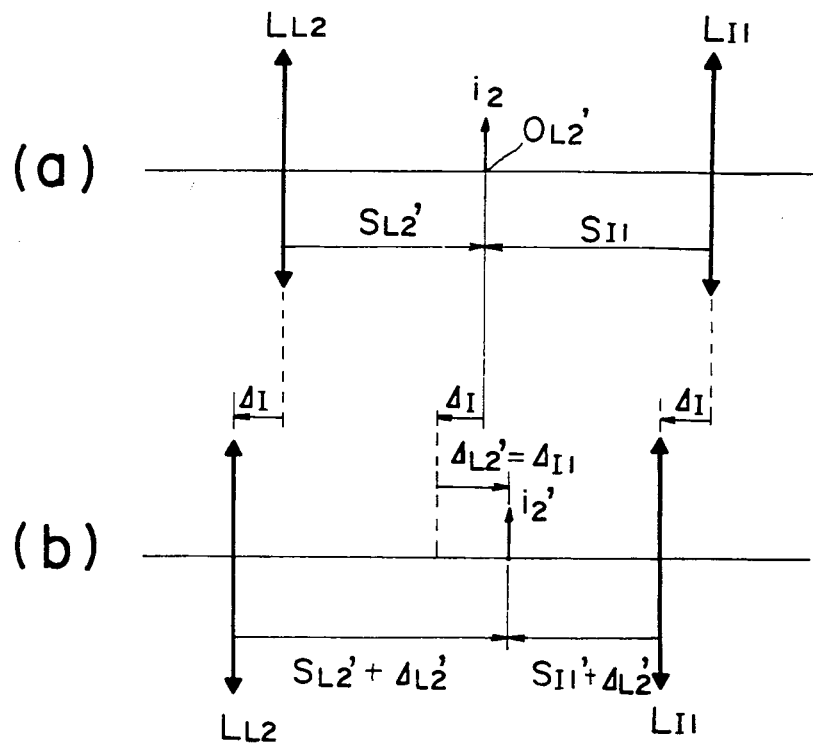

Thus, since displacing the image point $O'_{L2}$ at which the second illuminant image $i_2$ is produced by the displacement $\Delta'_L$ from the initial position of FIG. 10(a) to the position of FIG. 10(b) is equivalent to displacing the object point $O_{I1}$ of the first imaging lens $L_{I1}$ by the displacement $\Delta_{I1} (= \Delta'_L)$ in the relationship between the second illuminant image $i_2$ and first imaging lens $L_{I1}$, the relationship between the object point displacement $\Delta_{I1}$ and image point displacement $\Delta'_{I1}$ is expressed from the equation (13) as follows:

$$\Delta'_I = \Delta_{I1} m_{I1}^2 K_{I1} \tag{25}$$

The rate of change in magnification $K_{I1}$ is expressed from the equation (10) as follows:

$$K_{I1} = \frac{f_{I1}}{f_{I1} - \Delta_{I1} m_{I1}}. \tag{26}$$

Substituting the equation (26) for $K_{I1}$ of the equation (25) provides the image point displacement $\Delta'_{I1}$ with the following equation:

$$\Delta_{f1} = \frac{\Delta_{f1} m_{f1}^2 f_{f1}}{f_{f1} - \Delta_{f1} m_{f1}}. \tag{27}$$

Since the object displacement $\Delta_{f1}$ equals the image point displacement $\Delta'_{L2}$ of the second illuminating lens $L_{L2}$, substituting the equation (24) for the object point displacement $\Delta_{f1}$ provides the following equation:

$$\Delta_{f1} = \frac{\Delta_L f_{f1} f_{L2} m_{f1}^2 m_{L2}^2}{f_{f1} f_{L2} - \Delta_L (f_{f1} m_{L2} + f_{L2} m_{f1} m_{L2}^2)}. \tag{28}$$

Figure 11:
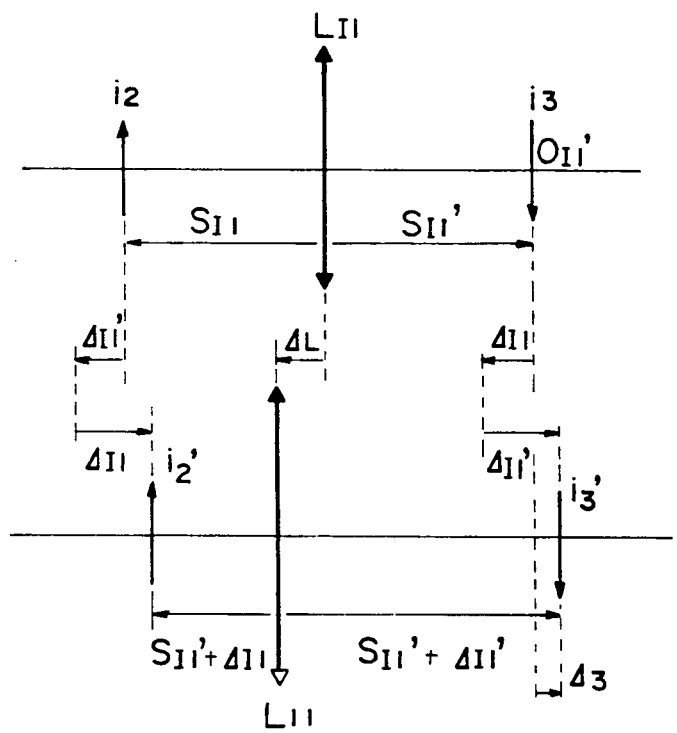

Thus, as shown in FIG. 11, displacing the first imaging lens $L_{f1}$ by the displacement $\Delta_L$ displaces the third illuminant image $i_3$ produced at the image point $O'_{f1}$ by the displacement $\Delta_3$ in which the displacement $\Delta_L$ is subtracted from the displacement $\Delta'_{f1}$.

Therefore, the displacement $\Delta_3$ is expressed by the following equation:

$$\Delta_3 = \Delta'_{f1} - \Delta_L \tag{29}.$$

Substituting the equation (28) for $\Delta'_f$ of the equation (29) and then arranging the resulting equation (29) provide the following equation:

$$\Delta_3 = \frac{A - B}{C}, \tag{30}$$

wherein $$A = Lf_{f1}f_{L2}m^2_{f1}m^2_{L2},$$

$$B = L\{f_{f1}f_{L2} - L(f_{f1}m_{L2} + f_{L2}m_{f1}m^2_{L2})\},$$

and $$C = f_{f1}f_{L2} - L(f_{f1}m_{L2} + f_{L2}m_{f1}m^2_{L2}).$$

In the equation (30), conditions required for equalizing the magnifications of the first illuminant image $i_1$ and third illuminant image $i_3$ and producing the first and third illuminant images $i_1$ and $i_3$ at the same position in an inverted relation with each other are as follows:

$$m_{f1} \cdot m_{L2} = -1 \tag{31}$$

$$m^2_{f1} \cdot m^2_{L2} = 1 \tag{32}.$$

Substituting the equations (31) and (32) for $m_{f1}$ of the equation (30) and then arranging the resulting equation (30) provide the following equation:

$$\Delta_3 = \frac{\Delta_L^2 \cdot m_{L2}(f_{f1} - f_{L2})}{f_{f1}f_{L2} - \Delta_L m_{L2}(f_{f1} - f_{L2})}. \tag{33}$$

Since the second imaging lens $L_{f2}$ produces the fourth illuminant image $i_4$ at the entrance pupil position of the reduction lens $L_R$ from the third iluminant image $i_3$, the image point displacement $\Delta'_{L4}$ of the second imaging lens $L_{f2}$ is expressed from the equation (13) as follows:

$$\Delta'_{L4} = \Delta_3 \cdot m_{f2} \cdot K_{f2} \tag{34}.$$

In this case, since the rate of change in magnification $K_{f2}$ is expressed from the equation (10) as follows:

$$K_{12} = \frac{f_{f2}}{f_{f2} - \Delta_3 m_{f2}}, \tag{35}$$

substituting the equation (35) for $K_{f2}$ of the equation (34) provides the image point displacement $\Delta'_{L4}$, which is expressed as follows:

$$\Delta_{L4} = \Delta_3 \cdot m_{f2} \cdot \frac{f_{f2}}{f_{f2} - \Delta_3 m_{f2}}. \tag{36}$$

Thus, substituting the equation (33) for $\Delta_3$ of the equation (36) and then arranging the resulting equation (36) provides the relationship between the image point displacement $\Delta'_{L4}$ of the second imaging lens $L_{f2}$ and the displacement $\Delta_L$ of the unit of the second illuminating lens $L_{f2}$ and first imaging lens $L_{f1}$ as follows:

$$\Delta_{L4}' = \tag{37}$$

$$\frac{\Delta_L^2 m_{L2} m_{f2} f_{f2} (f_{f1} - f_{L2})}{f_{f1} f_{L2} f_{f2} - \Delta_L m_{L2} f_{f2} (f_{f1} - f_{L2}) - \Delta_L^2 m_{L2} m_{f2} (f_{f1} - f_{L2})}.$$

The general magnification $K_L$ of the fourth illuminant image $i_4$ produced at the entrance pupil position of the reduction lens $L_R$ is expressed as follows:

$$K_L = K_{L2} \cdot K_{f1} \cdot K_{f2} = \tag{38}$$

$$\frac{f_{L2}}{f_{L2} - \Delta_L m_{L2}} \cdot \frac{f_{f1}}{f_{f1} - \Delta_{f1} m_{f1}} \cdot \frac{f_{f2}}{f_{f2} - \Delta_3 m_{f2}}.$$

The object point displacement $\Delta_{f1}$, which equals the image point displacement $\Delta'_{L2}$, is computed from the displacement $\Delta_L$ of the unit of the second illuminating lens $L_{L2}$ and first imaging lens $L_{f1}$ by the equation (24). The image displacement $\Delta_3$ is also computed from the displacement $\Delta_L$ by the equation (33).

Thus, when the displacement $\Delta'_{L4}$ of the fourth illuminant image $i_4$ in which the object space focal length $f_{L2}$ of the second illuminating lens $L_{L2}$ is $-76.77$ mm, the object space focal length $f_{f1}$ of the first imaging lens $L_{f1}$ is $-30$ mm, the object space focal length $f_{f2}$ of the second imaging lens $L_{f2}$ is $-81$ mm, the magnification $m_{L2}$ is $1/4.3353$, the magnification $m_{f1}$ is $-4.3353$ (in inverted image) and the magnification $m_{f2}$ is $-3.7778$ in accordance with the above-described dimensions when the allowable entrance pupil position range of the reduction lens $L_R$ is, e.g., 2 mm, is below the allowable entrance pupil position range of 2 mm within a predetermined range (e.g., plus minus 0.02) relative to the reference value of an opening ratio defined as a ratio of the diameter of an illuminant image to the diameter of an entrance pupil and generally selected to be 1 or less, the illuminating light from the illuminant 5 effectively falls on the reduction lens $L_R$.

The following Table 2 shows computation results of image point displacements $\Delta_{L4}$ to the displacements $\Delta_L$ of the unit of the second illuminating lens $L_{L2}$ and first imaging lens $L_{f1}$ and opening ratios $\sigma$ of the second imaging lens diameters d of the fourth illuminant image $i_4$ caused when the pattern image $I_2$ is magnified and reduced at the magnification $K_f$.

TABLE 2

| $K_f$ | $\Delta_L$ | $\Delta'_{L4}$ | $\sigma/d$ |
|---|---|---|---|
| 1.15 | 3.795 | 0.983 | 0.88/12.26 |

TABLE 2-continued

| $K_I$ | $\Delta_L$ | $\Delta'_{L4}$ | $\sigma/d$ |
|---|---|---|---|
| 1.10 | 2.669 | 0.483 | 0.87/12.17 |
| 1.05 | 1.412 | 0.134 | 0.87/12.09 |
| 1.01 | 0.296 | 0.006 | 0.86/12.02 |
| 1.00 | 0.000 | 0.000 | 0.86/12.00 |
| 0.99 | −0.304 | 0.006 | 0.86/11.98 |
| 0.95 | −1.600 | 0.170 | 0.85/11.92 |
| 0.90 | −3.430 | 0.776 | 0.85/11.84 |
| 0.85 | −5.547 | 2.018 | 0.84/11.77 |

As seen in Table 2, when the second pattern images $I_2$ in which the circular pattern of the reticle 11 is magnified and reduced at desired magnifications are produced, the displacement $\Delta'_{L4}$ of the illuminant image $i_4$ is restricted essentially within the allowable entrance pupil position range of 2 mm of the reduction lens $L_R$ within the allowable range of plus minus 0.02 of the opening ratio and the entrance pupil position of the reduction lens $L_R$ need not be specially adjusted.

Thus, storing the relationships between the magnifications $K_I$ of the pattern images and the corresponding displacements $\Delta_1$ of the unit of the second illuminating lens $L_{L2}$ and first imaging lens $L_{I1}$ as the stored table in the storage 38c of the pattern control device 37 can immediately cause to compute displacements corresponding to the magnifications $K_I$ of the unit of the lenses $L_{L2}$ and $L_{I1}$ when the processor 38b receives magnification selection data. This computation causes the drive motor 20 to adjust the magnification of the pattern image. Immediately from this magnification adjustment, a simple displacement of the unit of the second illuminating lens $L_{L2}$ and first lens $L_{I1}$ with a predetermined distance therebetween fixed can cause the second pattern image $I_2$ to be restricted within the allowable object space focal depth of the reduction lens $L_R$ and the fourth illuminant image $i_4$ to be restricted within the allowable entrance pupil position range of the reduction lens $L_R$ within an allowable opening ratio range, so that a fixed distance between the second imaging lens $L_{I2}$ and the reduction lens $L_R$ need not be corrected.

Thus, after a completion of the adjustment of the optical system 4, a focal point adjustment between the reduction lens $L_R$ and the exposed material 2 is carried out. Moving the XYZ-stage 1 along the optical axis causes this focal point adjustment. Since a distance k between the optical center of the reduction lens $L_R$ and the underside of the fixed hollow cylinder 41 is fixed, a target value in which the value of the distance k is subtracted from a target value b is first set by means of a target value setter 50a. In this state, the air supply source 44 supplies pressurized air through the restriction 45 to the nozzles 43 to cause the air micrometer 48 and the focal point adjustment control device 50 to be in operative positions.

When the focal point adjustment control device 50 is in operative position, the deviation signal of a difference between the preset target value of the target value setter 50a and a differential pressure detection signal from the differential pressure transducer 46 is supplied to the drive circuit 50b. The drive circuit 50b produces a drive signal to the linear drive mechanism 1e to move the XYZ-stage 1 vertically or along the Z axis so that the deviation signal becomes O. Thus, the focal point adjustment between the reduction lens $L_R$ and exposed material 2 is completed.

After the focal point adjustment is completed, the xyz-stage 1 is appropriatety moved along the XY axes to position the exposed material 2 at a predetermined pattern exposure position. Then, an appropriate portion of the exposed material 2 is exposed to the projected pattern. Then, the XYZ-stage 1 is again moved along the XY axes to move the exposed material 2 to a next pattern exposure position. Thus, the step-and-repeat operation of exposing the exposed material 2 to the projected pattern is repeated to complete the exposures at all the exposure positions of the exposed material 2. The exposed material 2 which has been exposed is taken off the XYZ-stage 1. A next exposed material 2 is placed on the XYZ-stage 1 and then subjected to the same processing as described above.

When the size of the projected pattern exposing the exposed material 2 is desired to change, a desired magnification $K_I$ is applied to the pattern input selector 40 of the pattern control device 37 to cause the drive motor 20 to displace the unit of the second illuminating lens $L_{L2}$ and first imaging lens $L_{I1}$ by the displacement $\Delta_I$ in accordance with the magnification $K_I$ to adjust the magnification of the second pattern image $I_2$.

On the other hand, when a desired polygonal pattern, e.g., rectangular pattern of predermined dimensions is projected to the exposed material 2, the support framework 23 is removed and the four blades 16a, 16b, 19a and 19b may be caused to together provide the desired polygonal pattern and project same only by means of the reduction lens $L_R$ on to the exposed material.

In accordance with the embodiment as described above in detail, displacing in unit the second illuminating lens $L_{L2}$ and first imaging lens $L_{I1}$ sandwiching the reticle 11 can steplessly change the magnification of the second pattern image $L_2$ produced at the image point $O'_{L2}$ of the second imaging lens $L_{I2}$ so that the displacement $\Delta''_I$ of the second pattern image $I_2$ is restricted within the allowable object space focal depth range of the reduction lens $L_R$ and the displacement $\Delta'_{L4}$ of the fourth illuminant image $i_4$ produced at the entrance pupil position of the reduction lens $L_R$ is restricted within the allowable entrance pupil position range of the reduction lens $L_R$ within the pretermined allowable opening ratio range. Thus, the pattern image is effectively projected, an exposure unevernness in the projected pattern exposing the exposed material 2 is eliminated to provide a high resolution, and the distance between the second imaging lens $L_{I2}$ and reduction lens $L_R$ need not be corrected.

In accordance with the first embodiment, each of the lenses $L_{L1}$, $L_{L2}$, $L_{I1}$ and $L_{I2}$ is formed with a single lens. However, alternatively a plurality of lerses may together form each of the lenses $L_{L1}$, $L_{L2}$, $L_{I1}$ and $L_{I2}$.

In accordance with the first embodiment, the part of the unit of the second illuminating lens $L_{L2}$ and first imaging lens $L_{I1}$ is moved. However, a manner of movement is not restricted to such movement but the part of the reticle 11 may be moved.

In accordance with the first embodiment, the circular pattern of the reticle 11 constitutes a pattern source. However, the form of the pattern source is not restricted to the circular pattern but a plurality of recticles 11 with patterns having different forms may be arranged on the periphery of a circle on a disc which is rotated, so as to position a desired pattern at the optical axis 6, or optional pattern source, e.g., another mask may be employed.

In accordance with the first embodiment, the pairs of the cams 31a and 31b and cam followers 32a and 32b are employed for the vertical drive mechanism 28 in order to move the unit of the second illuminating lens $L_{L2}$ and first imaging lens $L_{I1}$. However, the vertical drive mechanism 28 is not restricted to the pairs of the cams and cam followers but a drive mechanism, e.g., a feed screw mechanism may linearly drive the slide shafts 24a and 24b.

In accordance with the first embodiment, the present invention is applied to a reduction projection aligner. However, the present invention is not restricted to the reduction projection aligner but is also applicable to a pattern writing apparatus writing a pattern of a pattern source, e.g., of a pattern generator on an exposed material by means of an optical lens unit and to another optical imaging apparatus.

What is claimed is:

1. An optical imaging method comprising the steps of:

transmitting illuminating light from an illuminant onto an exposed material by means of an optical lens system comprising at least a pattern source with a projected pattern and a projection lens opposite to the exposed material to image the projected pattern on the exposed material;

arranging the optical lens system such that a first illuminating lens, a second illuminating lens, the pattern source, a first imaging lens and a second imaginglens are arranged in successive order on an optical axis from the illuminant to the projection lens;

producing a first illuminant image by the first illuminating lens outside the image space focal point of the first imaging lens;

producing a second illuminant image by the second illuminating lens from the first illuminant image outside the object space focal point of the first imaging lens;

producing a third illuminant image by the first imaging lens from the second illuminant image at the same magnification as that of the first illuminant image on the first illuminant image outside the image space focal point of the first imaging lens;

producing the first pattern source image from the pattern source;

producing a fourth illuminant image by the second imaging lens from the third illuminant image at an allowable entrance pupil position of the projection lens and producing a second pattern source image from the first pattern source image within an allowable object space focal depth of the projection lens;

displacing a pair of the second illuminating lens and the first imaging lens and the pattern source relative to each other so that a distance between the second illuminating lens and first imaging lens is fixed; and selecting a magnification of the second pattern source image so that the second pattern image falls within the allowable object space focal depth of the projection lens and the fourth illuminant image falls on one of the entrance pupil position and within an allowable entrance pupil range of the projection lens.

2. An optical imaging apparatus in which illuminating light from an illuminant is transmitted onto an exposed material by means of an optical system having at least a pattern source with a projected pattern and a projection lens opposite to the exposed material to image the projected pattern on the exposed material, wherein the optical imaging apparatus comprises:

a first illuminating lens producing a first illuminant image from the illuminant outside the image space focal point of the first illuminating lens;

a second illuminating lens producing a second illuminant image within the image space focal point of the second illuminating image from the first illuminant image produced by the first illuminating lens so that the first illuminant image is taken as a virtual image;

a first imaging lens producing a first pattern image from a projected pattern of a pattern source provided within the image space focal point of the second illuminating lens outside the image space focal point of the first imaging lens and producing a third illuminant image from the second illuminant image at the same magnification as that of the first illuminant image on the first illuminant image; and a second imaging lens having the first pattern image and third illuminant image produced by the first imaging lens, outside the object space focal point of the second imaging lens, the second imaging lens producing the first pattern image withinin an allowable object space focal depth of the projection lens and producing a fourth illuminant image from the third illuminant image at an allowable entrance pupil position of the projection lens, the first illuminating lens, second illuminating lens;

the first imaging lens and second imaging lens being arranged in sequence on an optical axis; and a pair of the second illuminating lens and the first imaging lens and the pattern source being movable relative to each other so that as distance between the second illuminating lens and first imaging lens is fixed.

3. The optical imaging apparatus of claim 2 wherein the distance between the second illuminating lens and first imaging lens is smaller than the total of the focal lengths of the second illuminating lens and the first imaging lens so that the pattern source and the second illuminant image are within the image space focal point of the second illuminating lens and outside the object space focal point of the first imaging lens.

* * * * *